(12) United States Patent
Aissou et al.

(10) Patent No.: US 9,377,684 B2
(45) Date of Patent: Jun. 28, 2016

(54) THIN FILMS ORGANIZED IN NANODOMAINS ON THE BASIS OF COPOLYMERS HAVING POLYSACCHARIDE BLOCKS FOR APPLICATIONS IN NANOTECHNOLOGY

(75) Inventors: Karim Aissou, Meylan (FR); Sami Halila, Beaucroissant (FR); Sebastien Fort, Uriage (FR); Redouane Borsali, Venon (FR); Thierry Baron, Saint Egreve (FR)

(73) Assignee: CENTRE NATIONAL DE LA RECHERCHE SCIENTIFIQUE (C.N.R.S), Paris (FR)

( * ) Notice: Subject to any disclaimer, the term of this patent is extended or adjusted under 35 U.S.C. 154(b) by 354 days.

(21) Appl. No.: 13/812,904

(22) PCT Filed: Jul. 29, 2011

(86) PCT No.: PCT/FR2011/051843
§ 371 (c)(1),
(2), (4) Date: Apr. 8, 2013

(87) PCT Pub. No.: WO2012/013911
PCT Pub. Date: Feb. 2, 2012

(65) Prior Publication Data
US 2013/0189609 A1    Jul. 25, 2013

(30) Foreign Application Priority Data

Jul. 30, 2010   (FR) ...................................... 10 56336

(51) Int. Cl.
*G03F 7/004*    (2006.01)
*G03F 7/40*    (2006.01)
(Continued)

(52) U.S. Cl.
CPC .................. *G03F 7/004* (2013.01); *B82Y 30/00* (2013.01); *C08G 81/02* (2013.01); *C09D 105/00* (2013.01);
(Continued)

(58) Field of Classification Search
CPC ............. G03F 7/004; G03F 7/40; G03F 1/00; C09D 105/00; C09D 153/00; C09D 187/005; B82Y 30/00
USPC ................... 430/322, 325, 329, 330; 428/532
See application file for complete search history.

(56) References Cited

U.S. PATENT DOCUMENTS 7,045,851 B2    5/2006   Black et al.
7,964,107 B2 *  6/2011   Millward ........................ 216/17
(Continued)

FOREIGN PATENT DOCUMENTS

EP    2 088 618 A1    8/2009
FR    2 927 467 A1    8/2009
(Continued)

OTHER PUBLICATIONS

Otsuka et al, "Thermoresponsive Vesicular Morphologies Obtained by Self-Assemblies of Hybrid Oligosaccharide-block-poly(N-isopropylacrylamide) Copolymer Systems", Langmuir 26(4), 2325-2332 (2010).*
(Continued)

*Primary Examiner* — Amanda C Walke
(74) *Attorney, Agent, or Firm* — Young & Thompson

(57) ABSTRACT

A material (M) includes a substrate one of the surfaces of which is covered with a layer based on a block copolymer having a block (B) consisting of a polysaccharide and to its uses for electronics, in order to prepare organic electroluminescent diodes (OLEDs) or organic photovoltaic cells (OPV) or for designing detection devices (nanobiosensors, biochips).

19 Claims, 5 Drawing Sheets

Figure 1:
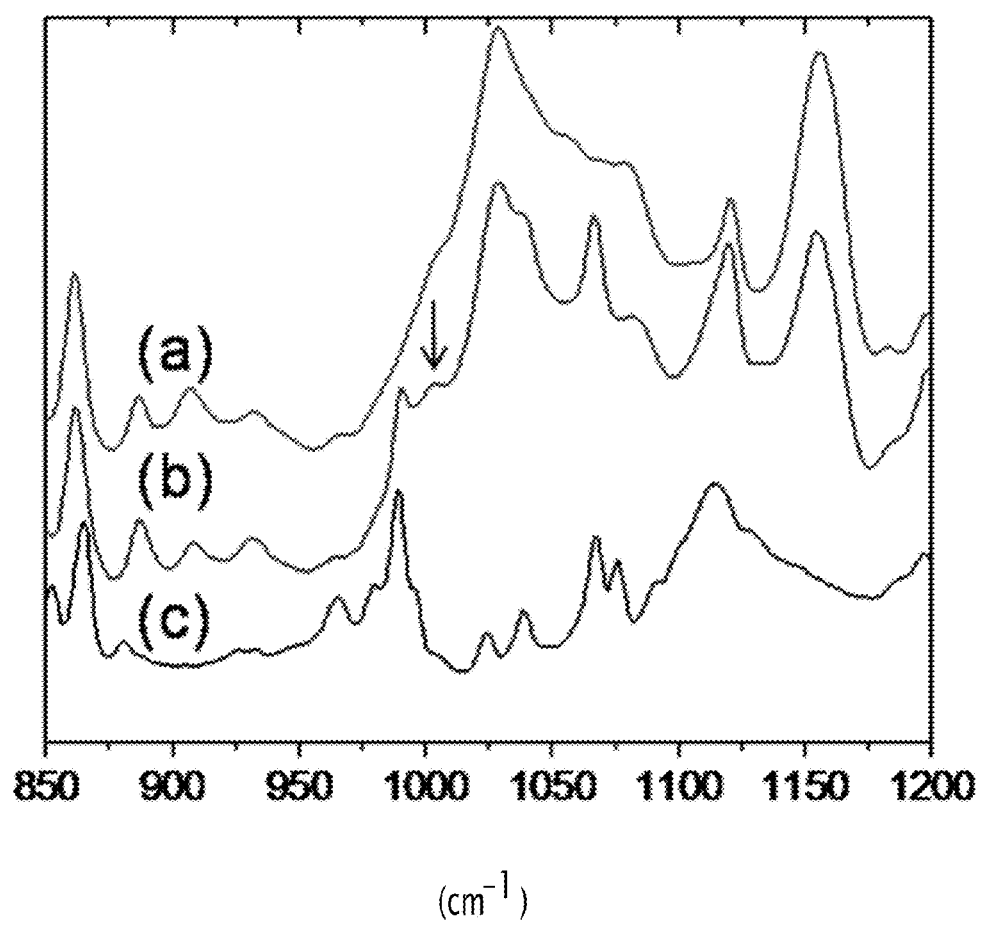

(51) Int. Cl.
  B82Y 30/00    (2011.01)
  C08G 81/02    (2006.01)
  C09D 187/00   (2006.01)
  H01L 29/423   (2006.01)
  H01L 29/788   (2006.01)
  C09D 105/00   (2006.01)
  C09D 153/00   (2006.01)
  G03F 1/00     (2012.01)

(52) U.S. Cl.
  CPC .......... *C09D 153/00* (2013.01); *C09D 187/005* (2013.01); *G03F 1/00* (2013.01); *G03F 7/40* (2013.01); *H01L 29/42332* (2013.01); *H01L 29/7881* (2013.01); *Y10T 428/31645* (2015.04); *Y10T 428/31667* (2015.04); *Y10T 428/31692* (2015.04); *Y10T 428/31971* (2015.04)

(56) References Cited

U.S. PATENT DOCUMENTS

| | | | |
|---|---|---|---|
| 7,968,398 | B2 | 6/2011 | Molas et al. |
| 2004/0256662 | A1 | 12/2004 | Black et al. |
| 2007/0155907 | A1 | 7/2007 | Zhao |
| 2011/0189242 | A1 | 8/2011 | Vandamme et al. |
| 2013/0022785 | A1* | 1/2013 | Ellison et al. .................. 428/141 |

FOREIGN PATENT DOCUMENTS

| | | |
|---|---|---|
| JP | H08-84769 | 4/1996 |
| JP | 2007-181691 | 7/2007 |
| WO | 2009/153447 A1 | 12/2009 |

OTHER PUBLICATIONS

Xiodan et al, "Pattern transfer using blockcopolymers", Philosophical Transactions of The Royal Society, 371 (2000), Theme Issue 'Molecular nanostructure and nanotechnology'(2013).*

Bosker et al, "Synthesis and Interfacial Behavior of Polystyrene-Polysaccharide Diblock Copolymers", Macromolecules.*

Cushen et al, "Oligosaccharide/Silicon-ContainingBlock Copolymers with 5 nm Featuresfor Lithographic Applications", ACS Nano, vol. 6, No. 4, 3424-3233 (2012).*

Giacomelli et al, "Block Copolymer Systems: From Single Chain toSelf-Assembled Nanostructures", Langmuir, 26(20),15734-15744 (2010).*

Otsuka et al, "Control of 10 nm scale cylinder orientation in self-organized sugar-based block copolymer thin films"Nanoscale, 5, 2637, (2013).*

International Search Report, dated Dec. 14, 2011, from corresponding PCT application.

Morgan Tizzotti et al., "Modification of Polysaccharides Through Controlled/Living Radical Polymerization Grafting—Towards the Generation of High Performance Hybrids", Macromolecular Rapid Communications, Jul. 8, 2010, pp. 1751-1772, vol. 31, XP-002620162.

Maribel Hernandez-Guerrero et al., "Polystyrene comb polymers built on cellulose or poly(styrene-co-2-hydroxyethylmethacrylate) backbones as substrates for the preparation of structured honeycomb films", European Polymer Journal, 2005, pp. 2264-2277, vol. 41.

Bo Kyung Yoon et al., "Direct Patterning of Self Assembled Nano-Structures of Block Copolymers via Electron Beam Lithography", Macromolecular Research, 2005, pp. 435-440, vol. 13, No. 5, XP-007906908.

* cited by examiner

THIN FILMS ORGANIZED IN NANODOMAINS ON THE BASIS OF COPOLYMERS HAVING POLYSACCHARIDE BLOCKS FOR APPLICATIONS IN NANOTECHNOLOGY

BACKGROUND OF THE INVENTION

1. Field of the Invention

The present invention relates to a material comprising a substrate, one of the surfaces of which is covered with a layer based on a block copolymer, and to its applications for:

- manufacturing a material useful for electronics, notably manufacturing flash memories, vertical transistors, non-sequential access memory (RAM), transistors according to the FET and CMOS technologies,
- for preparing organic light-emitting diodes (OLED) or components of organic photovoltaic cells (OPV), or
- for designing detection devices (nanobiosensors, biochips) which may be used in chemistry, agrofood industry or in the field of health care.

The self-assembling of block copolymers gives the possibility of controlling the organization of nanodomains, and thereby preparing films with an integration density of various nanometric objects (holes, studs, lamellas, pillars, layers . . . ) suitable for specific uses which require materials with a high density of active areas. This approach is of particular interest in industrial sectors, for which economic issues require exceeding the limits of conventional methods for developing increasingly miniaturized objects. For example, the development of microelectronics is limited by optical lithography or etching techniques. This is also the case of LED lighting which should exceed LCD, plasma technologies. Also, micro-array and micro-fluidic technologies are not suitable for the development of performing systems for simultaneous multi-detection and/or direct detection (SPR, SERS, fluorescent nanoprobes . . . ) of molecules or even at the scale of isolated molecules.

2. Description of the Related Art

U.S. Pat. No. 7,045,851 describes the use of a synthetic diblock copolymer consisting of polystyrene (PS) and of poly(methyl (meth)acrylate) (PMMA), deposited on a silicon oxide layer in order to form a discrete floating gate of a field effect transistor. The organized nanodomains based on PMMA blocks have a network period of the order of 40 nm.

Patent application EP 2 088 618 describes the use of a polystyrene (PS)-poly(methyl (meth)acrylate) (PMMA) diblock copolymer for preparing a lithographic mask. The method gives the possibility of preparing floating gates for microelectronics, for which the active area dimensions are 0.25×0.32 pm².

Zhang et al. (Advanced Material 2007 19, 1571-1576) describes the use of a polystyrene (PS)-polyethyleneoxide (PEO) diblock copolymer for preparing a useful lithographic mask for microelectronics. Organized nanodomains based on PEO blocks have a network period of the order of 22 nm. The roadmap of the ITRS (International Technology Roadmap for Semiconductors, 2005 Edition) indicates that a network of nanodomains with a period of less than 22 nm is the <<technological node>>, to be exceeded before 2020 in order to meet the economic challenges of the microelectronics sector.

SUMMARY OF THE INVENTION

The development of materials comprising nanodomain networks having smaller periods in order to allow better miniaturization of the devices used in microelectronics, for preparing organic light-emitting diodes or organic photovoltaic cells or for designing detection devices, is therefore particularly important. A goal of the present invention is to provide materials (M) comprising a nanodomain network having a smaller period than that of existing materials.

For this purpose, according to a first aspect, the invention provides a material (M) comprising a substrate, one of the surfaces of which is covered with a layer of an organized network based on a block copolymer (or possibly a mixture of block copolymers) comprising:

a block (A) consisting of a hydrophobic polymer, and
a block (B) consisting of a polysaccharide.

The material (M) comprises a substrate, one of the surfaces of which is partly or totally covered with a layer based on a block copolymer in the form of an organized network comprising nanodomains based on blocks (B) and/or nanodomains based on blocks (A). In the sense of the present application, a "network" is a set of points in three dimensions which have the following property: when a translation is performed in space along certain vectors, the same environment is exactly found again. There is spatial periodicity. The organized network according to the invention is characterized by a network period which corresponds to the distance between two nanodomains of blocks of the same nature of the self-assembled block copolymers.

This organization in nanodomains is due to the self-assembling of blocks having antagonistic properties. By "self-assembling" of the blocks, is meant that the blocks of same nature of the block copolymers were spontaneously ordered on the support in order to form the organized network, thanks to the antagonistic properties of the blocks of different natures (for example hydrophilic/hydrophobic; charged/neutral; polar/apolar; flexible/rigid blocks . . . ).

The inventors have actually discovered within the framework of the present invention that by replacing one of the blocks of a block copolymer of the prior art and capable of self-assembling in order to form an organized network, with a poly- or oligo-saccharide block and by preserving the total molecular weight of the block copolymer, the network period of the obtained organized network is smaller.

The layer of the material (M) according to the invention comprising the ordered film advantageously has a small network period, generally less than 22 nm, typically less than or equal to 20 nm, notably less than 15 nm, which may even reach 11 nm. This network period is smaller than in the films formed from other block copolymers of the prior art, which allows applications of the material (M) for manufacturing highly miniaturized objects for the needs of nanotechnologies, and in particular microelectronics.

Generally, the block copolymer has a weight average molecular weight of less than or equal to 40,000 g/mol. Weight average molecular weights of less than 40,000 g/mol actually promote the obtaining of a small network period.

The blocks (A) and (B) of the block copolymer are bound through a covalent bond. By "block copolymer", is meant that the copolymer consists of blocks in a linear sequence. In particular, comb copolymers which include branched chains, are not block copolymers.

The more there are blocks in the block copolymer, the more complex is the structure of the organized network layer. Therefore, the block copolymer is typically a diblock or triblock, preferably diblock copolymer.

The block (A) is a hydrophobic polymer, notably selected from a polystyrene, polyalkylstyrene, poly(alkyl (meth)acrylate), polyalkylene, polyacetylene, poly(polyphenylene oxide or sulfide), polydialkylsiloxane, polyvinylpyridine, polyalkyleneoxide, poly(alkyl thiophene) such as a poly(3- hexylthiophene), polypyrrole, poly-N-isopropylacrylamide, polycaprolactone, polyimide or polyester preferably biodegradable, such as a polyhydroxyalkanoate or a polylactide.

By <<(meth)acrylate>> is meant methacrylate or acrylate.

An alkyl may be linear or branched and generally comprises from 1 to 6 carbon atoms. An alkylene generally comprises from 1 to 6 carbon atoms.

Polyethylene, polyisoprene, polybutadiene and polyisobutylene are the preferred polyalkylenes. Polybutylstyrene is the preferred polylalkylstyrene. Polymethylmethacrylate, polybutylmethacrylate, polybutylacrylate and polyhexylacrylate are the preferred poly(alkyl (meth)acrylate). Polydimethylsiloxane is the preferred polydialkylsiloxane. Polyethylene oxide is the preferred polyalkyleneoxide.

Preferably, the block (A) consists of polystyrene, poly (alkyl (meth)acrylate) or poly(3-hexylthiophene), and in particular polystyrene or poly(alkyl (meth)acrylate).

The block (A) preferably consists of a polystyrene with a degree of polymerization from 10 to 30, notably from 15 to 20, in particular of 18.

The polysaccharide of the block (B) preferably has a degree of polymerization (DP) from 2 to 40, notably from 2 to 20, preferably from 5 to 9, in particular of the order of 7. The self-assembling of the block copolymers is actually promoted when the polysaccharide block (B) is of 2 to 40 units, notably from 2 to 20 units. Thus, the polysaccharide of the block (B) of the block copolymer may be an oligosaccharide (typically an oligosaccharide has a degree of polymerization of less than or equal to 10).

The units of the block (B) may consist of the same saccharide or of different saccharides. These saccharides may notably be selected from maltose, cellulose and its derivatives such as carboxymethylcellulose, cellulose acetate, hydroxyethylcellulose, starch, chitin, chitosan, xyloglucan, pectin, carrageenans, dextrans, glucans, notably beta 1,3- and beta 1,6- and O-glycans, N-glycans or C-glycans. Preferably, the block (B) is maltoheptaose or maltooctadecaose, in particular maltoheptaose.

The polysaccharides are advantageously derived from plant species and give the possibility of adding value to the biomass.

Polysaccharides may be synthesized via a chemical route or via a recombinant route (by engineering glycosyltranferases or glycosylhydrolases). They may advantageously be derived from biomasses of various origin: plants, algae, bacteria, fungi, industrial co-products, agricultural waste etc. . . . . It is thus possible to add value to the biomass by using its components at a nanometric scale, in particular for preparing materials with high added value and useful in nanotechnology.

A diblock copolymer wherein the block (A) is polystyrene and wherein the block (B) is maltoheptaose, is more preferred according to the invention.

Regardless of their nature, the diblock copolymers used according to the invention may be synthesized according to any method known per se, for example as described by the method described in "Block copolymers. I. Advances in polymer science, Vol. 189; Ed. Volker Abetz (Institut für Polymerforschung, Geesthacht, Germany)". Springer: Berlin, Heidelberg, New York. 2005.

In particular, the blocks (A) and (B) may be synthesized separately, and reactive terminal functions are then introduced chemically on each of the blocks (unless these functions are already present at the end of the synthesis of the block). Reactive terminal functions are selected so that they are orthogonal (i.e. the function of a block cannot react with the function of a block of same nature but is capable of exclusively reacting with different block functions). The blocks are then reacted with each other. This synthesis route (<<click>> route) is often preferred to other techniques since it avoids a step for protecting the OH groups contained on the polysaccharide.

Preferably, the volume fraction of the block (A) in the block copolymer is comprised between 0.1 and 0.4, notably when the degree of polymerization of the polysaccharide block (B) is between 2 and 20.

In an embodiment, the block (B) is bound through a hydrogen bond to at least one molecule comprising an amine, amide, hydroxyl function and/or a carboxylic acid function. These functions are actually particularly suitable for being bound through a hydrogen bond to the hydroxyl functions of the polysaccharide. The molecule generally has a low molecular weight, typically less than 500 g/mol. The molecule is not a saccharide block of another block copolymer. This molecule may for example be 4',4-bipyridine, 2',2-bipyridine, 2-(2,4-difluorophenyl)pyridine or 9-anthracene-carboxylic acid, preferably 4',4-bipyridine.

Hydrogen bonds may be formed between the molecule and the polysaccharide block (B) of the copolymer by dissolving the molecule and the block copolymer in an aprotic solvent, for example tetrahydrofurane, dioxane, toluene, chloroform, acetone, ether or dimethylformamide. Protic solvents of the water or alcohol type should be banned, since the formation of hydrogen bonds between the molecule and the oligopolysaccharide would compete with the formation of hydrogen bonds between the molecule and the protic solvent on the one hand and between the polysaccharide and the protic solvent on the other hand.

The self-assembling of the block copolymers is promoted by the presence of this molecule, although it is not indispensable. For example, it was verified by X-ray diffraction (SAXS spectrum) that the amylose-block-polystyrene system, and in particular the polystyrene-maltooctadecaose system, may be self-organized without the assistance of 4',4-bipiridine.

The presence of these molecules bound to the saccharide blocks (B) through hydrogen bonds has the effect of varying the parameters governing the phase diagram, i.e.: the volume fraction of the rigid block (B), or else the ratio $G=\omega/\chi$. [$\omega$, known as Maier-Saupe interactions, governs the interactions between the anisotropic rigid blocks; $\chi$, known as the Flory-Huggins parameter, expresses the repulsion between the different blocks]. In other words, the forming of supramolecular chains by attachment of these molecules has the effect of controlling the phase separation by providing the possibility of obtaining a different phase for a given annealing temperature during the $\beta$ step.

The molecule may be photoluminescent, i.e. it is capable of absorbing photons and then of re-emitting the absorbed energy as light with a bigger wavelength.

Generally, the molar proportion between the molecule and the block (B) varies between 0.1 and 1.0.

The substrate of the material (M) is typically a solid support of low roughness and with variable dimensions and/or shapes.

In a first embodiment, the substrate comprises silicon. The material (M) according to this embodiment will be designated as $(M_{Si})$ hereafter for reasons of conciseness. The substrate may consist in silicon, for example a silicon plate, or be in silicon covered with an insulating or dielectric material, for example $SiO_2$ microbeads. The layer of insulating or dielectric material covering the silicon notably has a thickness from 2 to 5 nm. This first embodiment is particularly suitable for applications in electronics.

A more preferred material comprises a silicon substrate, one of the surfaces of which is covered with a layer of an organized network based on a block copolymer comprising:
- a block (A) consisting of a polystyrene polymer with a degree of polymerization of 18, and
- a block (B) consisting of a maltoheptaose with a degree of polymerization of 7, said maltoheptaose being bound through a hydrogen bond to 4',4-bipyridine.

In a second embodiment, the substrate is a polymer (for example poly(3,4-ethylenedioxythiophene) (PEDT)), glass, metal (for example gold, titanium, platinum) or a metal oxide (for example titanium dioxide). The material (M) obtained according to this embodiment will be designated as ($M_{PVM}$) hereafter. This second embodiment is particularly suitable for OLED, OPV applications and nanobiosensors.

According to a second aspect, the invention relates to the method for preparing a material (M) as defined above, comprising a phase separation step, notably by heat treatment (annealing step).

The method may notably comprise steps consisting in:
α) depositing a solution comprising said block copolymer on a substrate in order to obtain a material (m),
β) heating the material (m) obtained at the end of step a) to a temperature from 140 to 220° C.

The preparation of the material (M) is included in a renewable industrial development by adding value to biomass on a nanometric scale (with replacement of synthetic polymers derived from petroleum with polysaccharides) and by preferentially using green chemistry methods.

The solvent of the solution applied in step α is typically an aprotic solvent, for example tetrahydrofurane.

Step α is typically carried out by depositing the solution by spin coating, by screen printing or with an ink jet. Deposition by an ink jet is particularly suitable for reducing the amount of solution used and thus the cost of the method and also allows deposition of the solution on localized areas of the surface of the substrate.

During step β, which corresponds to an annealing step, the blocks of the copolymer self-assemble, by which a material (M) is obtained comprising a substrate, one of the surfaces of which is covered with a layer based on a block copolymer in the form of an ordered film comprising nanodomains consisting of blocks (B) and generally nanodomains consisting of blocks (A) and nanodomains consisting of blocks (B). One skilled in the art knows how to adapt the conditions of this step by taking into account the antagonistic chemical properties of the blocks (A) and (B) [(hydrophilic/hydrophobic; charged/neutral; polar/apolar; flexible/rigid . . . ); (the polysaccharide block (B) being hydrophilic, polar and rigid and the block (A) being hydrophobic)] and more particularly the rigidity of the polysaccharide block (B) as well as its low solubility in an organic solvent.

The temperature during step β is from 140 to 220° C., preferably from 150 to 200° C. The annealing may be carried out in a controlled atmosphere, for example in a supercritical $CO_2$ medium.

The self-assembling of the block and therefore the geometry of the obtained network depends on several factors, such as the length of the chains of the polymer, the thickness of the layer, the temperature and the annealing time.

Characterization of the layer may be carried out with different techniques such as atomic force microscopy (AFM), transmission electron microscopy (TEM), ellipsometry, small angle X-ray scattering technique (SAXS), grazing incidence small angle X-ray scattering technique (GISAXS) or high resolution scanning electron microscopy (SEM).

The layer formed during step β) generally has a thickness of the order of the periodicity of the nanodomains formed.

Figure 2:
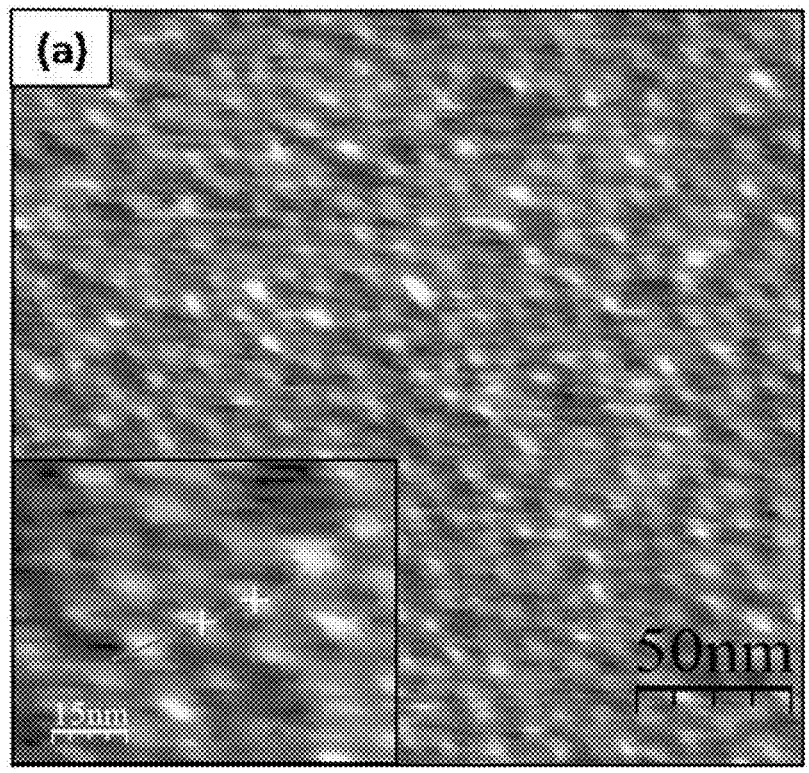

The nanodomains comprising polysaccharide blocks (B) may notably be oriented:
either parallel to the plane of the substrate, the material (M) is then called (M//) (FIG. 4); such an organization of block copolymers was described in patent FR 2 927 467, or perpendicularly to the plane of the substrate, the material (M) then being called (M⊥) (FIG. 2).

The parallel or perpendicular morphology of the periodic structure is controllable by the heat treatment, the nature of the solvents and by different factors relating to the composition of the blocks, notably by the block (B)/block(A) volume fraction.

For example, when the copolymer includes an equimolar amount of molecule bound through a hydrogen bond to the polysaccharide block (B) and of saccharide units in the polysaccharide block (B), the nanodomains generally form lines parallel to the plane of the substrate. On the other hand, when the copolymer includes an equimolar amount of molecule bound through a hydrogen bond to the polysaccharide block (B) and of hydroxyl groups in the polysaccharide block (B), the nanodomains generally form lines perpendicular to the plane of the substrate. When the copolymer includes less molecules bound through a hydrogen bond to the polysaccharide block (B) than saccharide units in the polysaccharide block (B), the nanodomains generally form cylinders, the axes of which are perpendicular to the plane of the substrate.

Thus, the nature of the blocks (A) and (B) of the block copolymer, their respective volume fractions, the presence or not of molecules bound through a hydrogen bond to the block (B) and the conditions of the steps α and β, are selected in order to obtain the most suitable crystalline system for the contemplated application.

For example, an organization perpendicular to the substrate (M⊥), notably a compact hexagonal phase of cylinders, the axis of which is perpendicular to the plane of substrate, is preferred for applications to vertical transistors, memories and nanobiosensors, which require the preparation of studs, holes and pillars, while an organization parallel to the substrate (M//) of the lamellar phase type is desired for OLED or OPV applications which require organization of the nanodomains parallel to the substrate.

Applications of the material (M) are described below, first of all nanoelectronics applications for preparing nanobiosensors, and then applications such as a component of an organic light-emitting diode or an organic photovoltaic cell.

According to a third aspect, the invention relates to the use of the material as defined above, as a precursor for a lithographic mask in electronics.

The object of the invention is notably:
a method for preparing a material ($M_{HOLE}$), comprising step a) consisting of treating the copolymer layer of the material (M) so as to selectively remove one of the blocks either (A) or (B) and form cavities separated from each other by the remainder of the copolymer, and
the material ($M_{HOLE}$) may be obtained by this method.

Thus, it is possible:
either to selectively remove the blocks (A) in order to form cavities separated from each other by the remaining blocks (B), the material then being designated as ($M_{HOLE(A)}$),
or selectively removing the polysaccharide blocks (B) in order to form cavities separated from each other by the remaining blocks (A), the material then being designated as ($M_{HOLE(B)}$).

Selective removal of one of the blocks may be achieved by plasma reactive etchings (notably with an oxygen plasma), by chemical or enzymatic treatment or by exposure to <<deep-UV>>.

In order to selectively remove the polysaccharide blocks (B) in order to obtain the material ($M_{HOLE(B)}$, step a) is carried out by putting the material (M) in contact with an acid selected among $H_5IO_6$, HCl or TFA (trifluoro-acetic acid). This treatment is different from those described earlier in documents US 2004/0256662 and FR 2 927 467. Moreover, this treatment is easily applied, unlike the reactive ion etching methods occurring with a plasma with specific apparatuses which require the control of many parameters (selection of the gases, pressure, power, temperature, bias).

The invention also relates to the use of material ($M_{HOLE}$) as a lithographic mask in electronics, notably for preparing a flash memory, a vertical transistor or a non-sequential access memory.

Thus, materials ($M_{HOLE}$) may be applied in a method for preparing a flash memory, a vertical transistor or a non-sequential access memory comprising the steps consisting in:
b) depositing a metal or semi-conducting material in the cavities formed during step a) on the material ($M_{HOLE}$),
c) treating the material obtained in step b) by plasma reactive etching, by chemical or enzymatic or UV treatment in order to selectively remove the remaining copolymer block and to form cavities separated from each other by the metal or semi-conducting material,
d) depositing a dielectric material, for example silicon dioxide in the cavities formed during step c).

When the material ($M_{HOLE(A)}$ is applied in step b), the remaining block, a remainder of copolymer of step c), consists in the blocks (B). When the material ($M_{HOLE(B)}$ is applied in step b), the remaining block of copolymer of step c) consists in the blocks (A).

This method and the metal, semi-conducting and dielectric materials which may be used, are notably described in documents US 2004/0256,652 and FR 2 927 467.

Figure 6:
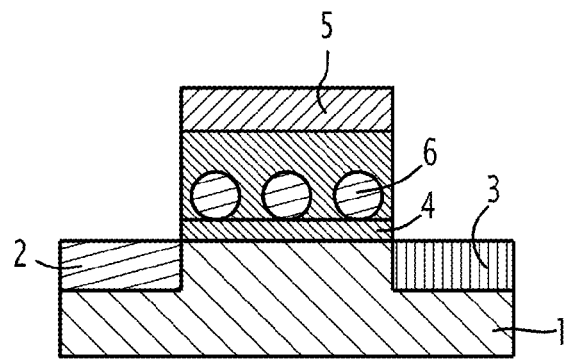

The type of organization of the nanodomains of the organized film layer on the substrate has an influence on the potential application possibilities. Thus, the material (M⊥) is particularly suitable for preparing a gate of a vertical transistor (FIG. 7) or of a RAM memory (FIG. 8) while a material (M//) is particularly adapted for preparing a floating gate of a flash memory (FIG. 6).

Generally, for the aforementioned electronic applications, the substrate of the material (M), and therefore of the material ($M_{HOLE}$) which is derived from it, comprises or consists in silicon, for example a silicon plate, or consists in a silicon plate covered with an insulating or dielectric material (for example $SiO_2$ microbeads), the layer of said insulating or dielectric material covering the plate for example having a thickness from 2 to 5 nm. The material ($M_{HOLE}$) was then obtained from the material ($M_{Si}$) as defined above. Silicon is actually the most used semi-conductor in electronics.

Flash memories, vertical transistors and RAM obtained from the material ($M_{HOLE}$) (and therefore from material (M)) are thus obtained by a simple and inexpensive method. The flash memories, vertical transistor and RAM obtained have a high density of organized patterns of nanometric size by the small network period of the nanodomains of the material (M) applied in their preparation method, and are therefore highly miniaturized.

Further, the invention relates to the use of the material ($M_{HOLE}$) for manufacturing nanobiosensors and nanobiochips.

Indeed, the material ($M_{HOLE}$) may be applied in a method for preparing a nanobiosensor or a nanobiochip, comprising step b') consisting of grafting biomolecules (such as peptides or proteins, antibodies, deoxyribonucleic acid, oligo- or polysaccharides . . . ) in cavities formed during step a) on the material ($M_{HOLE}$).

The nanobiosensor and the nanobiochip formed may be integrated into detection devices used in the medical field, in the agrofood industry or in chemistry.

According to a fourth aspect, the invention relates to an organic light-emitting diode (OLED) or an organic photovoltaic cell (OPV) comprising a material (M), in which the block (B) is bound through a hydrogen bond to a photoluminescent molecule comprising an amine, amide, hydroxyl function and/or a carboxylic acid function.

It is thus possible to manufacture OLEDs with good efficiency, at a low cost and on a substrate which may be rigid or flexible.

Presently, the OLEDs having good efficiency are made from several layers of materials:
electron transport layers (ETL),
active layer, and
hole transport layer (HTL),
which are sequentially deposited by evaporation in vacuo on an anode. This deposition method involves a higher manufacturing cost of the OLEDs than the one proposed in the present invention. Reduction in the manufacturing cost of the OLEDs according to the invention is related to the fact that the ordered film may either be deposited with a turntable, or by means of printing techniques such as screen printing or ink jet, which are inexpensive techniques. Further, the use of a thin film of blocked copolymers as a base material for preparing OLEDs no longer requires deposition in vacuo of different transport layers (ETL and HTL) since the separation of phases between the polysaccharide blocks and the other blocks of the block copolymer generates the presence of interfaces between the nanodomains which are as many interfaces for dissociation of excitons. The nanodomains formed in the films have a size of less than the diffusion length of excitons, typically of 10 nm. This is expressed by a highly efficient dissociation of excitons since the latter placed anywhere in the material find a closer dissociation interface than their diffusion length.

Further, the photoluminescent molecules are bound through a hydrogen bond to the nanodomains based on blocks (B) of the material (M) and consequently have a highly ordered spatial organization on the material (M). The signal emitted by an OLED comprising such a material (M) is therefore of interest.

BRIEF DESCRIPTION OF THE DRAWING FIGURES

The invention will further be illustrated with view to the following figures and examples.

FIG. 1 represents three Fourier Transform Infrared Spectra (FTIR) obtained with an FTIR spectrometer (Spectrum IR I, PERKIN ELMER) in the KBr mode, of the synthesized films in Example 1, i.e. the spectra of a polystyrene-maltoheptaose diblock copolymer film (curve (a)), of a polystyrene-maltoheptaose diblock copolymer bound through a hydrogen bond to 4,4'-bipyridine (curve (b)) and of 4,4'-bipyridine (curve (c)).

The arrow on the curve b shows the peak at 989 $cm^{-1}$ ($\delta$=15 $cm^{-1}$) characteristic of the formation of hydrogen bonds between 4,4'-bipyridine and the hydroxyl groups of maltoheptaose (displacement of a portion of the characteristic band of 4,4' bipyridine).

FIG. 2 is the atomic force microscopy image obtained with a "Picoplus Molecular Imaging" apparatus operating in a "taping" mode of a thin film of polystyrene-maltoheptaose diblock copolymer bound to a hydrogen bond to 4,4' bipyridine obtained according to Example 1 (a film prepared by depositing with a turntable a diluted copolymer solution (0.5% w/w) on an Si oxide substrate (100) followed by annealing in vacuo at 170° C. for 24 h). The nanodomains are in the form of cylinders, the axes of which is perpendicular to the plane of the substrate. The material corresponds to the material ($M_\perp$) with an organization of nanodomains in a cubic centered crystalline system. Each bright area corresponds to a nanodomain consisting of oligosaccharide blocks bound to 4,4'-bipyridine and the darker areas surrounding them correspond to polystyrene blocks.

Figure 3:
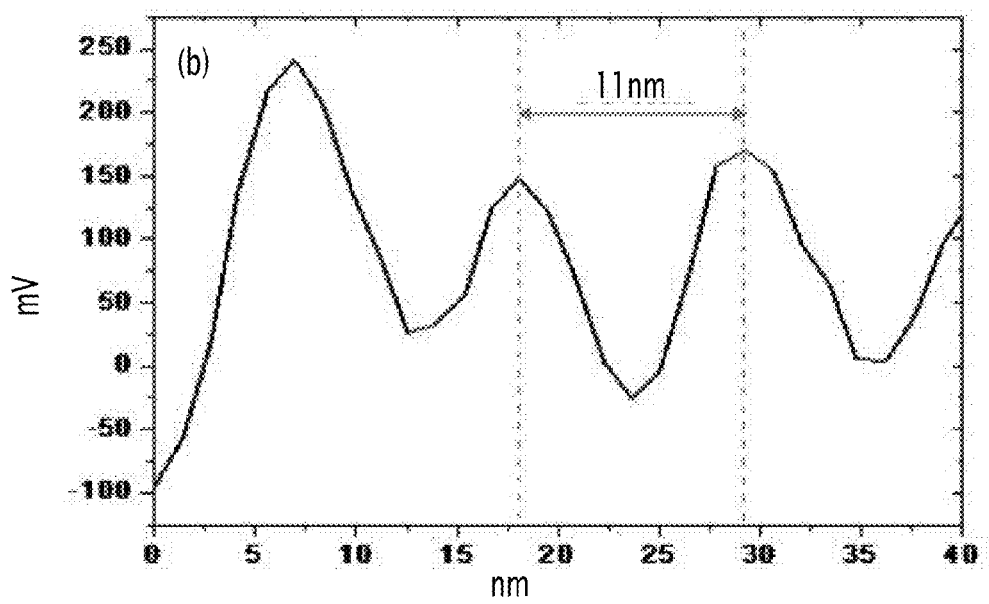

FIG. 3 represents a profile of a sectional view corresponding to a continuous line on the atomic force microscopy image in a phase mode of FIG. 2. The voltage in mV is represented versus the distance in nm. Each peak corresponds to a nanodomain consisting of oligosaccharide blocks bound to 4,4'-bipyridine. The network period is 11 nm.

Figure 4:
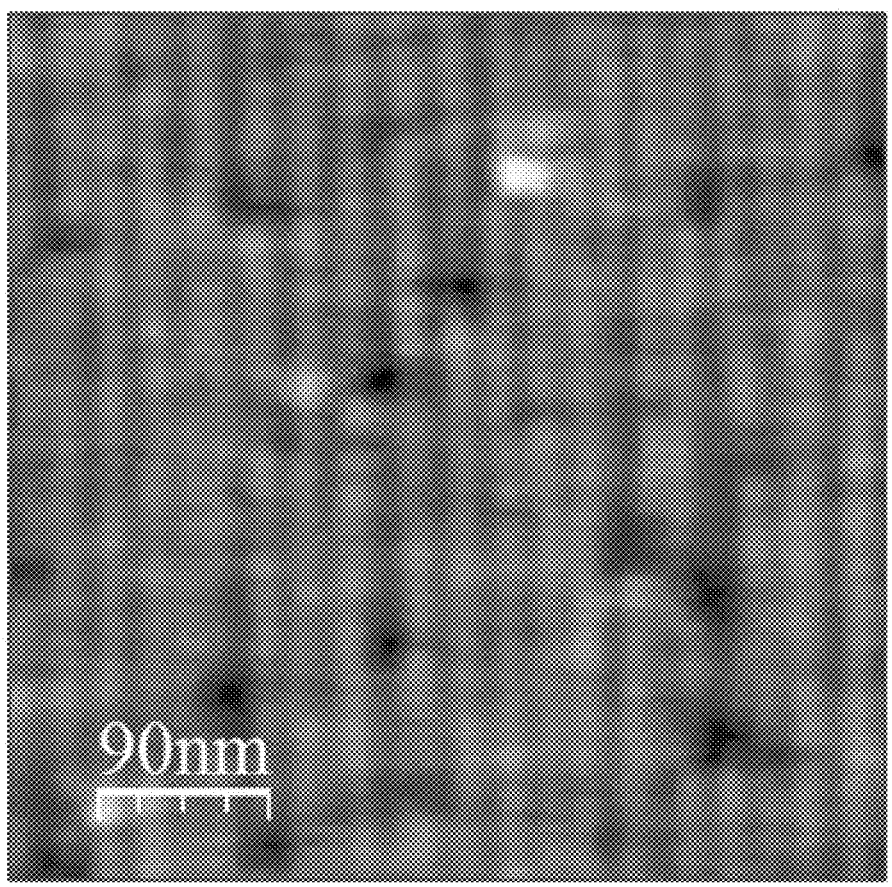

FIG. 4 is the image obtained in an atomic force microscope obtained with a "Picoplus Molecular Imaging" apparatus operating in the "taping" mode, of a thin film of polystyrene-maltoheptaose diblock copolymer bound through a hydrogen bond to 4,4'-bipyridine (a film prepared by depositing with a turntable a diluted copolymer solution (0.5% w/w) on an Si oxide substrate (100) followed by annealing in vacuo at 170° C. for 24 h). The nanodomains are parallel to the plane of the substrate. The material corresponds to the material (M//). Each bright line corresponds to a nanodomain consisting of oligosaccharide blocks bound to 4,4'-bipyridine and the darker lines surrounding them correspond to polystyrene blocks.

Figure 5:
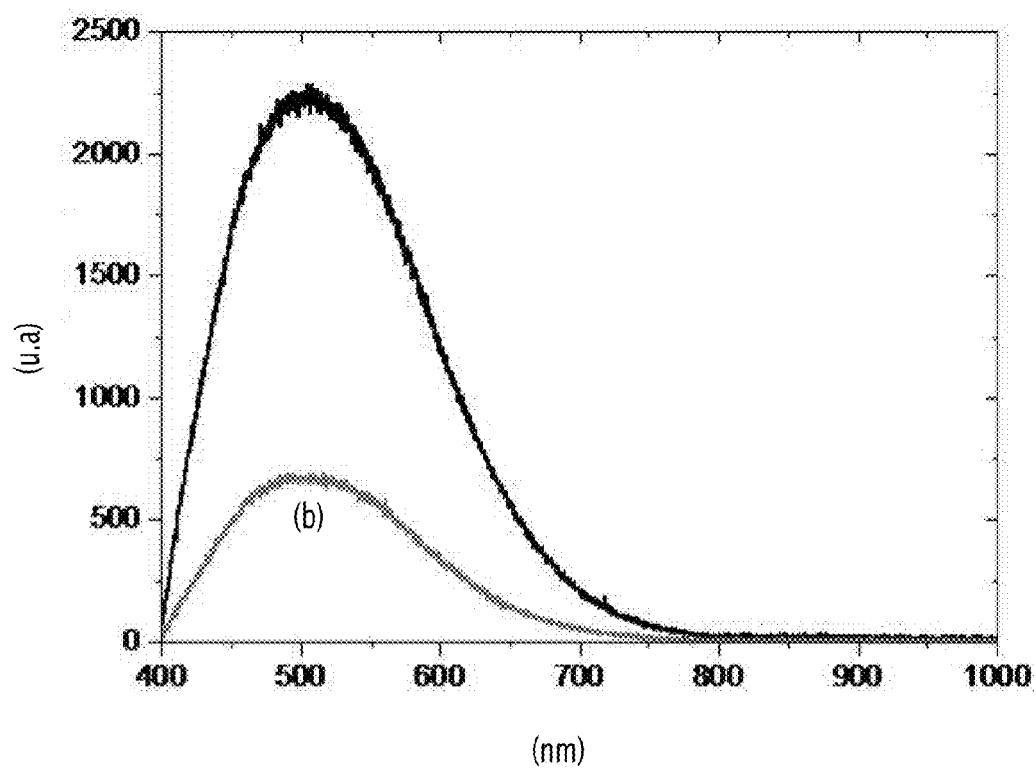

FIG. 5 illustrates the photoluminescence spectrum of a film of polystyrene-maltoheptaose diblock copolymer bound through a hydrogen bond to 4,4'-bipyridine (copolymer of Example 1) obtained by excitation at 365 nm after annealing at 170° C. for:
   a) 15 minutes (weak organization of the nanodomains) and
   b) after 45 hours (maltoheptaose nanodomains bound through a hydrogen bond to 4,4' bipyridine organized in a cubic centered crystalline system).

FIG. 6 corresponds to a schematic sectional view of a flash memory. (1): silicon (substrate used for preparing the material ($M_{Si}$)); (2): Source; (3): Drain; (4): $SiO_2$ (dielectric material); (5): Gate (polysilicon); (6): Floating grid in metal or semi-conducting material.

Figure 7:
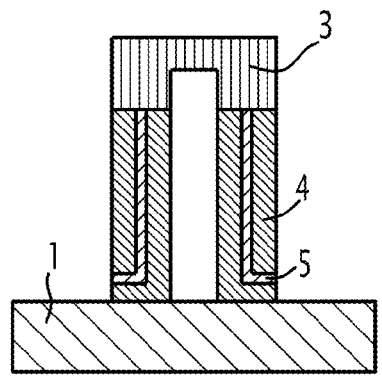

FIG. 7 corresponds to a schematic sectional view of a vertical transistor: (1): silicon source (substrate used for preparing the material ($M_{Si}$)); (3): Drain; (4): $SiO_2$ (dielectric material); (5): Gate (polysilicon).

Figure 8:
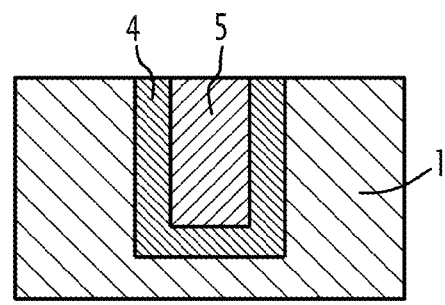

FIG. 8 corresponds to a schematic sectional view of a RAM memory: (1): silicon (substrate used for preparing the material ($M_{Si}$)); (4): $SiO_2$ (dielectric material); (5): Gate (polysilicon, TaN). The area occupied by $SiO_2$ and the gate corresponds to nanoholes obtained by etching the silicon of the substrate of the material (M1).

DETAILED DESCRIPTION OF THE INVENTION

EXAMPLE 1

Preparation of a Polystyrene-Maltoheptaose Diblock Copolymer a) Synthesis of ω-azido-polystyrene (Block (A)).
ω-azido-polystyrene was synthesized by following the procedure described by Fallais et al. (J. Polym Sci Part A. Polym. Chem. 2000, 38, 1618) from chains of ω-hydroxyethylpolystyrene (Polymer Source Inc.) (Mn=3,700 g/mol; polydispersity index, PI=1.08).

b) Synthesis of N-maltoheptaosyl-3-acetamido-1-propyne
A suspension of maltoheptaose (10.0 g, 8.67 mmol), in propargylamine (11.9 mL, 174 mmol) was strongly stirred at room temperature for 72 hours. The reaction was tracked by thin layer chromatography (eluents: n-butanol/ethanol/water: 1/3/1, v/v/v). After complete disappearance of the starting product, the reaction medium was diluted in methanol (100 mL) and then precipitated in dichloromethane (300 mL). The solid was filtered and washed with a mixture of methanol and of dichloromethane (methanol/dichloromethane: 1/3, v/v; 300 mL).

A solution of acetic anhydride (Sigma Aldrich) in methanol (acetic anhydride/methanol: 1/20, v/v; 1 L) was added to the solid and the reaction mixture was stirred overnight at room temperature. After complete disappearance of the starting product tracked by thin layer chromatography (eluent: acetonitrile/water: 13/7, v/v), the solvent of the reaction medium was evaporated, and trace amounts of acetic anhydride were removed by co-evaporation in a toluene/methanol solution: 1/1, v/v. The resulting solid was dissolved in water and freeze-dried in order to obtain a white solid of N-maltoheptaosyl-3-acetamido-1-propyne (8.75 g, 78%).

c) Synthesis of the Diblock Copolymer (polystyrene (Block (A))-maltoheptaose (Block (B)):
A solution of pentamethyldiethylenetriamine (PMDETA) (2.24 mL, $1.07 \cdot 10^{-4}$ mol, two equivalents) was dissolved in dimethylformamide (20 mL) and then added into a flask under argon containing the ω-azido-polystyrene (200 mg, $5.36 \cdot 10^{-5}$ mol, one equivalent), N-maltoheptaosyl-3-acetamido-1-propyne (198 mg, $1.61 \cdot 10^{-4}$ mol, three equivalents) and a CuBr catalyst (15 mg, $1.07 \cdot 10^{-4}$ mol, two equivalents). The reaction medium was stirred at 40° C. for 72 hours until the infrared spectrum shows complete disappearance of the band of the azido group (at 2,100 $cm^{-1}$). The polystyrene-maltoheptaose copolymer was finally precipitated twice in methanol for removing the reagent excesses, and then dried at 60° C. in vacuo.

EXAMPLE 2

Preparation of a Polystyrene-maltoheptaose Diblock Copolymer Bound through a Hydrogen Bond to 4,4'-bipyridine In a tetrahydrofurane solution containing 0.1% by weight of polystyrene-maltoheptaose diblock copolymer of Example 1 was added an equivalent of 4',4-bipyridine (Sigma Aldrich) by a hydroxyl group present on the maltoheptaose blocks. This solution was then intensively stirred for one day at room temperature, in order to allow formation of hydrogen bonds between the hydroxyl groups and the bipyridine molecules.

Fourier transform infrared spectra (FTIR) were obtained (FIG. 1) on the polystyrene-maltoheptaose diblock copolymer (curve a) and on 4,4' bipyridine (curve c) as well as on the polystyrene-maltoheptaose diblock copolymer bound through a hydrogen bond to 4,4'-bipyridine (curve c).

EXAMPLE 3

Preparing an Organized Film with a Perpendicular Organization of Nanodomains (M⊥)

The film was made from the diblock copolymer of Example 2, comprising 4,4'-bipyridine. A solution of this copolymer (volume fraction 40%) in THF was deposited with a turntable (spin coating) (deposition parameters: v=3,000 rpm, a=1,000 rpm/s and t=30 s) on a silicon substrate. The freshly deposited film was brought to anneal for one day at 170° C. in vacuo in order to allow phase separation leading to the formation of nanodomains consisting of oligosaccharides bound through a hydrogen bond to the 4',4-bipyridine, organized in a cubic centered network (FIG. 2). The phase from a sectional view corresponding to a continuous line on the atomic force microscopy image of FIG. 2 is illustrated in FIG. 3. Each peak corresponds to a nanodomain consisting of oligosaccharide blocks bound to 4,4' bipyridine. The period of the obtained network is 11 nm.

EXAMPLE 4

Preparing a Film with a Parallel Organization of Nanodomains (M//)

A film prepared from the copolymer of Example 2 comprising 4,4'-bipyridine was organized according to the procedure of Example 2 (annealing at 170° C. for 24 h) by depositing with a turntable (spin coating) on a silicon substrate a solution of the copolymer (volume fraction 30%) in a THF/DMS solvent: 1/1, v/v. The material obtained had nanodomains organized parallel to the plane of the substrate (FIG. 4).

EXAMPLE 5

Use of the Material of Example 3 for Preparing OLEDs

As a demonstration, two films were prepared from the copolymer of Example 2 comprising 4,4'-bipyridine with annealing at 170° C. for 15 minutes or 45 hours in order to result in the organization of nanodomains of maltoheptaose bound through a hydrogen bond to 4,4'-bipyridine in a cubic centered system (FIG. 2). The photoluminescence spectra (excitation at 365 nm) of these films are illustrated in FIG. 5 and demonstrate the feasibility of the application of the materials for preparing OLEDs. These spectra also show that the photoluminescence intensity is better for film exposed to longer annealing, which allowed better organization of the nanodomains.

EXAMPLE 6

Selective Withdrawal of Polysaccharide Nanodomains from the Film in Order to Obtain the Material ($M_{HOLE}$) which may be Used in Micro- or Nano-electronics Applications The treatment of the material of Example 3 was carried out with a trifluoroacetic acid solution in order to selectively remove the maltoheptaose nanodomains and form cavities separated from each other by the remaining polystyrene, which may be used for preparing a flash memory (FIG. 6), a vertical transistor (FIG. 7), a non-sequential access memory (FIG. 8) or for preparing nanobiosensors. Alternatively, the treatment may be carried out with hydrochloric acid instead of trifluoroacetic acid.

The invention claimed is:

1. A material (M) comprising a substrate, one of the surfaces of which is covered with a layer of an organized network based on a block copolymer comprising:
a block (A) formed from a hydrophobic polymer, and
a block (B) formed from a polysaccharide.

2. The material (M) according to claim 1, wherein the block copolymer has a weight average molecular weight of less than or equal to 40,000 g/mol.

3. The material (M) according to claim 1, wherein the polysaccharide of block (B) is maltoheptaose.

4. The material (M) according to claim 1, wherein the polymer of block (A) consists of polystyrene, poly(alkyl (meth)acrylate) or poly(3-hexylthiophene).

5. The material (M) according to claim 1, wherein the block (B) is bound through a hydrogen bond to at least one molecule comprising an amine, amide, hydroxyl function and/or a carboxylic acid function, notably 4,4'-bipyridine, 2',2-bipyridine, 2-(2,4-difluorophenyl)pyridine or 9-anthracene carboxylic acid.

6. The material (M) according to claim 5, wherein said molecule is 4,4'-bipyridine, 2',2-bipyridine, 2-(2,4-difluorophenyl)pyridine or 9-anthracene-carboxylic acid.

7. An organic light-emitting diode or organic photovoltaic cell comprising a material (M) according to claim 5, wherein the block (B) is bound through a hydrogen bond to a molecule comprising an amine, amid, hydroxyl function and/or a carboxylic acid function, said molecule being photoluminescent.

8. The material (M) according to claim 1, wherein the substrate comprises silicon.

9. The material (M) according to claim 1, wherein the substrate is a polymer, glass, metal or a metal oxide.

10. The material according to claim 1, comprising a silicon substrate, one of the surfaces of which is covered with a layer of an organized network based on a block copolymer comprising:
a block (A) formed from a polystyrene polymer with a degree of polymerization of 18, and
a block (B) formed from a maltoheptaose with a degree of polymerization of 7, said maltoheptaose being bound through a hydrogen bond to 4',4-bipyridine.

11. A method for preparing a material (M) according to claim 1, comprising:
α) depositing a solution comprising said block copolymer on a substrate in order to obtain a material (m),
β) heating the material (m) obtained at the end of step α) to a temperature from 140 to 220° C.

12. A method for preparing a mask pattern in electronics, comprising:
providing a material (M) comprising a substrate, one surface of which is covered with a layer of an organized network based on a block copolymer comprising a block (A) formed from a hydrophobic polymer, and a block (B) formed from a polysaccharide; and
treating the copolymer layer of the material (M) so as to selectively remove one of the blocks either (A) or (B) and to form cavities separated from each other by a remainder of the copolymer.

13. A material ($M_{HOLE}$) which is obtained by:
providing a material (M) comprising a substrate, one surface of which is covered with a layer of an organized network based on a block copolymer comprising a block (A) formed from a hydrophobic polymer, and a block (B) formed from a polysaccharide; and
treating the copolymer layer of the material (M) according to claim 1, so as to selectively remove one of the blocks either (A) or (B) and to form cavities separated from each other by the remainder of the copolymer.

14. A mask pattern in electronics, for preparing a flash memory, a vertical transistor or a non-sequential access memory, formed from the material ($M_{HoLE}$) according to claim 13.

15. The material (M) according to claim 13, wherein the block copolymer has a weight average molecular weight of less than or equal to 40,000 g/mol.

16. The material (M) according to claim 13, wherein the polysaccharide of block (B) is maltoheptaose.

17. The material (M) according to claim 13, wherein the polymer of block (A) consists of polystyrene, poly(alkyl (meth)acrylate) or poly(3-hexylthiophene).

18. The material (M) according to claim 13, wherein the block (B) is bound through a hydrogen bond to at least one molecule comprising an amine, amide, hydroxyl function and/or a carboxylic acid function, notably 4,4'-bipyridine, 2',2-bipyridine, 2-(2,4-difluorophenyl)pyridine or 9-anthracene carboxylic acid.

19. The material (M) according to claim 13, wherein the substrate comprises silicon.

* * * * *